United States Patent [19]
Gilleo et al.

[11] Patent Number: 5,531,942
[45] Date of Patent: Jul. 2, 1996

[54] METHOD OF MAKING ELECTROCONDUCTIVE ADHESIVE PARTICLES FOR Z-AXIS APPLICATION

[75] Inventors: Kenneth B. Gilleo, West Kingston, R.I.; Michael C. Corey, Morristown, N.J.

[73] Assignee: Fry's Metals, Inc., Providence, R.I.

[21] Appl. No.: 261,912

[22] Filed: Jun. 16, 1994

[51] Int. Cl.$^6$ ............................................. B29B 9/10
[52] U.S. Cl. ............................ 264/5; 264/13; 264/104; 264/105
[58] Field of Search ............................ 264/5, 4, 13, 104, 264/105

[56] References Cited

U.S. PATENT DOCUMENTS

| | | | |
|---|---|---|---|
| 3,320,658 | 5/1967 | Bolda et al. | 29/155.5 |
| 3,541,222 | 11/1970 | Parks et al. | 174/68.5 |
| 3,786,134 | 1/1974 | Amagi et al. | 423/445 R |
| 4,113,981 | 9/1978 | Fujita et al. | 174/88 |
| 4,209,481 | 1/1980 | Kashiro et al. | 264/24 |
| 4,273,675 | 6/1981 | Shiiki et al. | 502/9 |
| 4,420,443 | 12/1983 | Kaji et al. | 264/15 |
| 4,449,774 | 5/1984 | Takashi et al. | 339/59 |
| 4,640,981 | 2/1987 | Dery et al. | 174/88 |
| 4,696,764 | 9/1987 | Yamazaki | 252/503 |
| 4,701,279 | 10/1987 | Kawaguchi et al. | 252/511 |
| 4,729,809 | 3/1988 | Dery et al. | 156/306.6 |
| 4,740,657 | 4/1988 | Tsukagoshi et al. | 174/88 |
| 4,811,081 | 3/1989 | Lyden | 357/80 |
| 4,817,277 | 4/1989 | Hieber et al. | 29/832 |
| 4,902,857 | 2/1990 | Cranston et al. | 174/94 |
| 4,931,598 | 6/1990 | Calhoun et al. | 174/117 |
| 4,985,663 | 1/1991 | Nakatani | 315/169.3 |
| 5,001,302 | 3/1991 | Atsumi | 174/94 |
| 5,041,183 | 8/1991 | Nakamura et al. | 156/264 |
| 5,049,085 | 9/1991 | Reylek et al. | 439/91 |
| 5,057,370 | 10/1991 | Krieg et al. | 264/104 |
| 5,074,947 | 12/1991 | Estes et al. | 156/307.3 |
| 5,123,986 | 6/1992 | Sugiyama et al. | 156/230 |
| 5,129,833 | 7/1992 | Rowlette, Sr. | 439/91 |
| 5,147,210 | 9/1992 | Patterson et al. | 439/91 |
| 5,155,301 | 10/1992 | Mase | 174/88 |
| 5,174,766 | 12/1992 | Yoshizawa et al. | 439/91 |
| 5,183,969 | 2/1993 | Odashima | 174/88 |
| 5,216,807 | 6/1993 | Yoshizawa et al. | 29/876 |
| 5,401,445 | 3/1995 | Menchhofer | 264/13 |

FOREIGN PATENT DOCUMENTS

| | | |
|---|---|---|
| 2831984 | 2/1979 | Germany . |
| 60-44787 | 10/1985 | Japan . |
| 62-7195 | 1/1987 | Japan . |
| 63-40217 | 2/1988 | Japan . |
| 63-171913 | 11/1988 | Japan . |
| 1-10508 | 1/1989 | Japan . |

*Primary Examiner*—Robert A. Dawson
*Assistant Examiner*—Kenneth M. Jones
*Attorney, Agent, or Firm*—Shapiro and Shapiro

[57] ABSTRACT

Electroconductive resin adhesive particles are incorporated in a dielectric-resin-adhesive-containing carrier to form a Z-axis adhesive. Particles are preferably produced by printing techniques or by in-fluid forming techniques, the latter being particularly suited for the formation of substantially spherical particle shapes. The particles also have use as discrete adhesive members.

14 Claims, 2 Drawing Sheets

STEP 1 - STENCIL CONDUCTIVE ADHESIVE PASTE

STEP 2 - HARDEN CONDUCTIVE ADHESIVE

STEP1 — BGA BOTTOMSIDE — PLACE SPHERES

HEAT TO BOND SPHERES

STEP2 — SPHERES — BGA

SIDE VIEW

STEP3
PLACE ON CIRCUIT AND HEAT TO BOND

BGA — CONTACT PAD — CIRCUIT

METHOD OF MAKING ELECTROCONDUCTIVE ADHESIVE PARTICLES FOR Z-AXIS APPLICATION

BACKGROUND OF THE INVENTION

This invention relates to anisotropically electroconductive or so-called Z-axis adhesives. The invention is more particularly concerned with novel electroconductive bodies or particles for use in such adhesives and with adhesives incorporating such particles.

Z-axis adhesives are well known and have been used commercially in the electronics industry for a number of years. The underlying concept of these materials is really quite simple. Basically, a carrier containing a dielectric resin adhesive is loaded with a minor amount of electrically conductive, non-bonding particles (usually metal spheres) which ultimately serve to provide the desired electrical connections. The carrier may be in the form of a solvent-containing paste, in which the particles are randomly dispersed. The paste may be sandwiched as a thin coating between opposed surfaces of electronic components to be joined and to be electrically connected at selected locations. Heat and pressure are then applied to the sandwich such that the dielectric adhesive is caused to conform to the topography of the opposed component surfaces and to bond them adhesively.

Electrical connections are established by pressure contacts of the non-bonding conductive particles and the electrical contact pads on the opposed component surfaces. The loading of conductive particles in the carrier is kept low enough as to avoid the formation of continuous electrically conductive paths through the particles in the adhesive plane (X,Y plane).

Pastes as just described are also commonly formed into thin Z-axis films, as by casting. Such films, which thus consist of a random dispersion of conductors in a sheet-like carrier of dielectric adhesive, are used in an analogous manner to pastes in order to effect bonding of components.

Reliability of electrical connections formed by non-bonding conductive particles requires that the particles be maintained under stress by the dielectric adhesive. In practice, however, the connections are subject to failure due to such factors as stress relaxation of the dielectric adhesive film and corrosion of metalized surfaces. Differential thermal coefficients of expansion of materials in the circuit assembly may also lead to deterioration of the electrical connections.

Z-axis adhesives employing solder and solder-coated particles, which provide a bonding effect, are also known. Solder, however, is compatible with only a limited range of contact surface materials, and contact surfaces must be cleaned of oxides by fluxing. Solder also requires the application of relatively high temperatures, typically about 220° C., to effect bonding. Such high temperatures are undesirable in many applications. Liquid crystal displays, for example, cannot tolerate such temperatures. Nor can many low cost circuits, such as those made on Mylar (polyester), tolerate soldering. Solders used in the electronics industry also commonly include lead, which has been linked to various health and environmental problems.

SUMMARY OF THE INVENTION

The present invention takes an entirely new approach to the concept of Z-axis adhesives. More particularly, the invention is based on the use of electroconductive resin adhesive bodies or particles in place of such conventional materials as described above. The use of electroconductive resin adhesive bodies or particles is effective to avoid the disadvantages associated with traditional non-bonding conductors. Moreover, such resin adhesives are compatible with a wide range of contact surface materials, including materials with which solder is incompatible, and the use of lead is avoided. In addition, electroconductive resin adhesives offer the advantage of relatively low bonding temperatures.

Accordingly, in one of its principal aspects, the present invention provides an anisotropically electroconductive adhesive material, comprising bodies of fusible, electroconductive resin adhesive randomly dispersed in a carrier including a fusible, dielectric, resin adhesive. The invention also provides methods for making such an adhesive.

According to another of its principal aspects, the invention provides particles, and methods of making such particles, which are suitable for use in the adhesive materials of the invention. The method contemplates, for example, the production of substantially spherical electroconductive adhesive particles through the use of in-fluid forming techniques. Adhesive printing techniques are also contemplated.

According to still another of its principal aspects, the invention provides an electronic circuit component having discrete bodies or particles of fusible, electroconductive resin adhesive bonded to a plurality of contact pads. The attached bodies are effective for bonding and electrically connecting the circuit component to the surface a circuit board, for example.

BRIEF DESCRIPTION OF THE DRAWINGS

The aforementioned and additional aspects of the present invention, as well as its many advantages, will be more fully appreciated from the detailed description hereinafter, taken in conjunction with the accompanying drawings in which.

DETAILED DESCRIPTION OF THE INVENTION

Figure 1A:
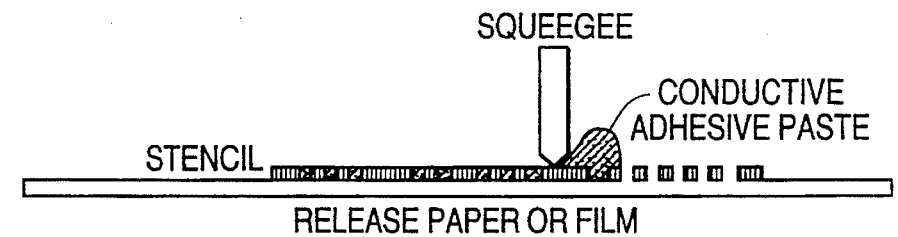
FIGS. 1A and 1B diagrammatically illustrate steps for forming discrete electroconductive resin adhesive bodies according to a first embodiment of the invention.
Figure 1B:
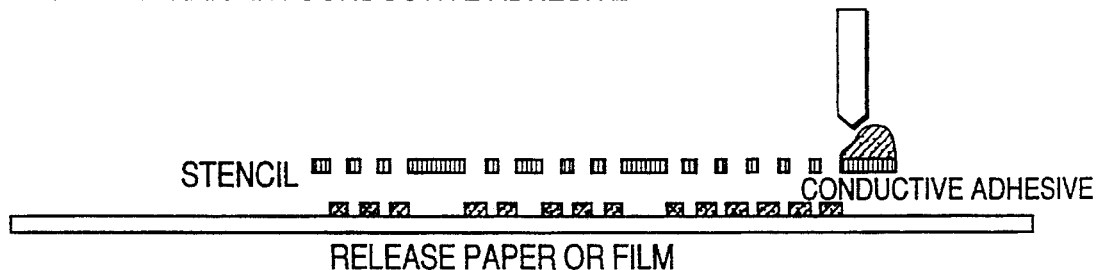
Figure 2:
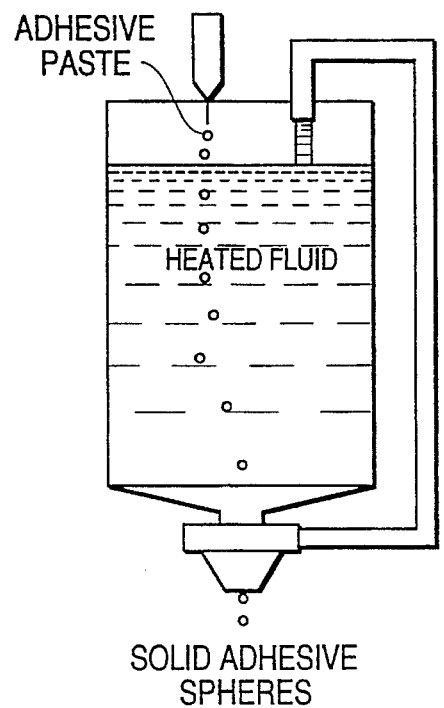
FIG. 2 diagrammatically illustrates the formation of substantially spherical electroconductive resin adhesive bodies.

FIGS. 1A–1B and FIG. 2 depict techniques for making discrete, fusible, electroconductive resin adhesive bodies in accordance with the present invention. FIGS. 1A and 1B show an exemplary printing technique, in which the bodies of electroconductive adhesive are screened or stenciled onto the surface of a release material. FIG. 2 shows a technique in which bodies of substantially spherical shape are produced by in-fluid formation.

It will be readily understood that the present invention is not limited to the use of particular electroconductive or dielectric adhesive materials, the techniques herein described being applicable to such materials generally. Both thermoplastic- and thermosetting-resin-based adhesive systems may be used, and each offers somewhat different advantages. Thermoplastics most notably offer the advantages of reworkability with heating, short bonding times, and well developed mechanical properties which facilitate handling. Thermosetting resins, on the other hand, typically offer the advantage of increased bonding strength. Mixtures of both resin types may be used.

Exemplary electroconductive thermoplastic adhesives include silver- or gold-filled phenoxy resin, polyester (e.g., PET), polysulfone, polyacrylate, polyurethane (PUR-polyurethane rubber), polyhydroxy ether, and polysiloxane-polyimide copolymer type thermoplastic adhesives. A preferred electroconductive thermoplastic adhesive is available from Alpha Metals, Inc. of Jersey City, N.J., as STAYSTIK™ 181—a silver-particulate filled phenoxy resin adhesive sold as a thixotropic paste suitable for screen printing or syringe dispensing. Exemplary electroconductive thermosetting resin adhesives include silver- or gold-filled epoxy, polyimide, silicone, cyanate ester, phenolic resin, and cross-linking acrylic type thermosetting adhesives. A preferred electroconductive thermosetting adhesive is Alpha Metals' Poly-Solder, a silver-filled epoxy product of the type described in U.S. Pat. No. 5,180,523 issued Jan. 19, 1993 (incorporated herein by reference).

The electroconductive adhesive bodies produced in accordance with the invention may be dispersed in a suitable dielectric-resin-adhesive-containing carrier in any suitable manner, such as by mixing the bodies into a solvent-containing dielectric adhesive paste. The resin of the bodies, of course, should not be soluble in the solvent vehicle of the paste. Suitable loading of conductive adhesive for Z-axis applications is typically from about 5% to about 25% of the total volume of adhesive (i.e., the total volume of electroconductive and dielectric adhesive, including any fillers, free of solvent). Given the basic principles described herein, the selection of compatible materials for purposes of practicing the invention will readily be accomplished by those of ordinary skill in the art.

The formation of electroconductive resin adhesive bodies in accordance with the invention will now be explained in further detail with reference to the exemplary techniques illustrated in FIGS. 1A–1B and FIG. 2.

FIGS. 1A and 1B depict an exemplary technique for printing the electroconductive resin adhesive bodies. In the illustrative technique, the bodies are formed on the surface of a release material, the particular type of which is not critical. An exemplary material is D2B/D2B silicon release paper, available from Akrosil Company of Menasha, Wis. Initially, a metal stencil, for example, is placed on a release paper or film which has been secured in place, and an electroconductive-resin-adhesive-containing paste is deposited onto the surface of the release material through the stencil by squeegee doctor-blading (FIG. 1A). The stencil is thereafter removed so as not to disturb the paste deposits, and the electroconductive adhesive is then hardened by volatilizing the solvent from the paste, preferably with heating (FIG. 1B). In the case of a thermosetting adhesive, the temperature-time profile is preferably selected to partially polymerize the resin to a B-stage. The upper surfaces of the electroconductive bodies may assume a slightly convex, domed shape as a result of the effects of surface tension. After the electroconductive bodies have been allowed to cool, they may readily be removed from the release material, as by scraping with a plastic blade.

Typical dimensions of the finished bodies for Z-axis application may range from about 25 to about 300 microns in height by about 5 to about 25 microns in cross-dimension. Other printing techniques for forming the bodies on the release material include pneumatic dispensing and pin-array dispensing, for example.

FIG. 2 shows a technique particularly suited for forming electroconductive adhesive resin bodies of substantially spherical shape. Spherically shaped particles are preferred for use in Z-axis adhesive products in accordance with the invention, because their uniform dimensions offer greater reliability in terms of forming good electrical connections in Z-axis applications.

As shown in FIG. 2, droplets of electroconductive adhesive paste are dropped into a vessel of heated liquid. A liquid is preferably chosen which has a specific gravity slightly less than that of the conductive adhesive, whereby the adhesive sinks slowly through the liquid under the effect of gravity. Alternatively, the liquid may have a high viscosity. The droplets, incidentally, may themselves be formed in a substantially spherical shape by pneumatic dispensing, ink jetting, or any common precision liquid dispensing technique.

The adhesive, suspended in the liquid, will assume a substantially spherical shape due to surface tension. Hardening occurs under the effect of heat. For better results, the fluid., which should of course be a non-solvent for the adhesive resin, should be kept at a temperature sufficiently low to avoid void formation as any solvent in the adhesive volatilizes.

The hardened spheres can be collected at the bottom of the vessel in any suitable manner. For example, liquid containing the spheres can be drained off and the spheres filtered out, with the liquid being pumped back into the vessel in order to provide a continuous process.

When applying the foregoing technique to a thermosetting resin adhesive, the liquid temperature and the adhesive settlement time may be controlled to produce a desired level of polymerization. It is preferable to partially polymerize such adhesives to a B-stage, so that subsequent bonding may be performed at relatively low temperature. The aforementioned Poly-solder, for example, may be B-staged by maintaining at 140°–150° C. for about five minutes.

For thermoplastic conductive adhesives, such as the aforementioned STAYSTIK™ 181, time control is less critical. Since no chemical hardening (polymerization) occurs with thermoplastics, the spheres can be left in the heated fluid for an extended period of time. It is desirable to have a thermal gradient in the vessel, cooler at the bottom, so that the spherical bodies harden and do not stick together. Thermoplastics can also be formed into solid shapes which are subsequently melted to form spheres in the heated liquid medium. For example, a thermoplastic conductive paste can be cast into a film and dried. The film can then be cut into appropriate shapes, such as disks, and then melted into spheres. As another example, the thermoplastic adhesive can be extruded into rods or fibers which can be cut into small columns and then melted into spheres.

While not especially preferred, a gaseous fluid medium, such as air, may be used in place of liquid to form the adhesive bodies. The adhesive could be kept suspended in a gaseous jet stream, which may be heated.

For Z-axis adhesive applications, a sphere diameter of up to about 25 microns is generally suitable. The minimum sphere diameter is ordinarily determined by the particle size of a conductive filler of the electroconductive adhesive. Conventional conductive filler particles are usually no smaller than about 1 micron in size. Since several filler particles should be contained in an individual sphere for purposes of conductivity, the smallest sphere diameter will usually be about 5 microns.

EXAMPLE 1

Alpha Metals' Poly-Solder-R paste was placed into a 100 cc dispensing syringe which was fitted with a 0.033 in.

inside diameter stainless steel dispensing tip from EFD, Inc. of Providence, R.I. A 500 ml beaker was filled to the 400 ml level with deionized water, which was brought to a boil using a laboratory hot plate. Drops of Poly-Solder were dispensed into the boiling water, and after one hour, were removed in the form of hardened substantially spherical particles which could readily be handled without sticking.

EXAMPLE 2

Poly-Solder-R was printed onto the surface of a sheet of D2B/D2B release paper, mentioned earlier, using a 0.003 in. thick metal stencil with 0.004 in. diameter round openings. The stencil was gently removed so as not to disturb the paste deposited through the holes, and the release paper with the conductive adhesive deposits was placed in an air oven at 150° C. for 25 minutes. After cooling, the resulting conductive particles were easily removed from the release material by scraping with a plastic blade.

In addition to Z-axis adhesive uses, it is possible to use particles in accordance with the present invention in discrete form, without further processing—that is, without a carrier. For example, discrete electroconductive adhesive spheres can be bonded to the contact pads of a ball grid array package in place of the conventionally used solder balls. Solder tends to "work harden" and fatigue during thermocycling, which is not a problem with electroconductive adhesives. The conductive adhesive particles, preferably spheres, can be placed on the package using conventional vacuum pick-up robots, and they can be bonded to the contact pads of the array by applying heat or heat with light pressure. The use of light pressure may slightly flatten the adhesive bodies, which may be desirable. The package, with bonded spheres, can be assembled to a circuit by placing it in the correct location over the corresponding connecting pads and applying heat with pressure to bond the adhesive bodies to the circuit. In the case of thermosetting resin adhesives, the temperature-time profile should be sufficient to fully cure the adhesive.

Figure 3A:
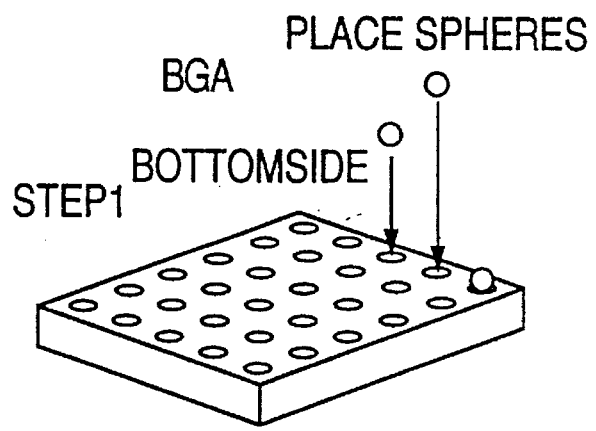
FIGS. 3A to 3C show the assembly of an electronic component to a circuit using such spherical bodies.
Figure 3B:
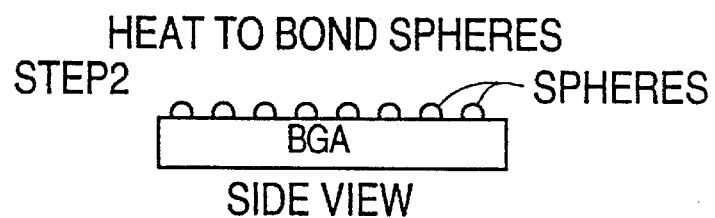
Figure 3C:
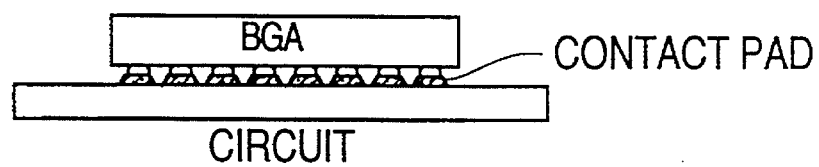

FIGS. 3A–3C depict the foregoing process. For purposes of such a process, the sphere diameter preferably ranges from about 0.5 mm to about 0.875 mm.

Another application of the spheres involves their use as conductive bodies in an ordered Z-axis film adhesive as described in our concurrently filed U.S. patent application entitled, "Methods for Producing Ordered Z-Axis Adhesive Materials, Materials So Produced, and Devices Incorporating Such Materials," incorporated herein by reference.

While several preferred embodiments of the invention have been described herein, it will be appreciated by those skilled in the art that various changes are possible in keeping with the basic principles of the invention, the scope of which is defined in the appended claims.

What is claimed is:

1. A method of making a substantially spherically shaped, electroconductive adhesive body, comprising the steps of:

depositing a small amount of electroconductive, fusible resin adhesive into a fluid medium which is effective to enable the adhesive to assume a substantially spherical shape; and maintaining the adhesive in the fluid medium for a time sufficient to cause the adhesive to assume such shape; and removing the adhesive from the fluid medium.

2. A method according to claim 1, wherein the fluid medium is heated.

3. A method according to claim 2, wherein the adhesive is deposited in droplet form into the fluid medium.

4. A method according to claim 3, wherein the adhesive contains a thermoplastic polymer component.

5. A method according to claim 4, wherein the adhesive contains an electrically conductive particulate filler.

6. A method according to claim 4, wherein the adhesive is deposited as part of a solvent-containing mixture.

7. A method according to claim 3, wherein the adhesive includes a thermosetting resin component.

8. A method according to claim 7, wherein the adhesive is maintained in the fluid medium for a time sufficient to harden the spherical body.

9. A method according to claim 7, wherein the adhesive is maintained in the fluid medium for a time sufficient to B-stage the thermosetting resin component of the spherical body.

10. A method according to claim 7, wherein the adhesive contains electrically conductive, particulate filler.

11. A method according to claim 7, wherein the adhesive is deposited as part of a solvent-containing mixture.

12. A method according to claim 2, including the step of causing the adhesive to sink through the fluid medium under the effect of gravity.

13. A method according to claim 2, wherein the fluid medium is water.

14. A method according to claim 13, wherein the water is at boiling temperature.

* * * * *